US009197241B2

(12) United States Patent
Liu

(10) Patent No.: US 9,197,241 B2
(45) Date of Patent: Nov. 24, 2015

(54) OUTPUT POWER CONTROL FOR RF DIGITAL-TO-ANALOG CONVERTER

(71) Applicant: Nokia Corporation, Espoo (FI)

(72) Inventor: Ting-Ping Liu, El Cerrito, CA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/137,012

(22) Filed: Dec. 20, 2013

(65) Prior Publication Data

US 2015/0180502 A1    Jun. 25, 2015

(51) Int. Cl.
*H03M 1/66* (2006.01)
*H03M 3/00* (2006.01)

(52) U.S. Cl.
CPC *H03M 3/32* (2013.01); *H03M 1/66* (2013.01); *H03M 3/51* (2013.01)

(58) Field of Classification Search
CPC ... H03M 1/1215; H03M 1/06; H03M 1/1019; H03M 1/1225; H03M 1/662; H03M 1/0624; H03M 1/0614; H03M 3/50; H03M 7/3017; H03M 1/0663; H03M 1/0836
USPC ......... 341/118, 120, 139, 140, 141, 142, 144; 370/310; 455/334
See application file for complete search history.

(56) References Cited

U.S. PATENT DOCUMENTS

| | | | | |
|---|---|---|---|---|
| 5,627,538 A | * | 5/1997 | Ferry | 341/144 |
| 6,356,224 B1 | * | 3/2002 | Wohlfarth | 341/147 |
| 6,473,011 B1 | * | 10/2002 | Steensgaard-Madsen | 341/118 |
| 6,549,157 B1 | * | 4/2003 | Tseng et al. | 341/147 |
| 6,977,602 B1 | * | 12/2005 | Ostrem et al. | 341/145 |
| 7,504,976 B1 | * | 3/2009 | Pellon | 341/143 |
| 8,164,501 B2 | * | 4/2012 | Venes et al. | 341/144 |
| 8,378,870 B1 | * | 2/2013 | Matsuura | 341/144 |
| 8,502,720 B1 | | 8/2013 | Wyville | |
| 8,576,951 B2 | * | 11/2013 | Mombers et al. | 375/316 |
| 2002/0063645 A1 | * | 5/2002 | Viswanathan | 341/143 |

(Continued)

FOREIGN PATENT DOCUMENTS

WO    WO-2014028036 A1    2/2014

OTHER PUBLICATIONS

Ravi, Ashoke et al. "A 2.4-GHz 20-40-MHz Channel WLAN Digital Outphasing Transmitter Utilizing a Delay-Based Wideband Phase Modulator in 32-nm CMOS", IEEE Journal of Solid-State Circuits, IEEE Service Center. Piscataway, NJ, USA. vol. 47, No. 12. Dec. 2012.

(Continued)

*Primary Examiner* — Linh Nguyen
(74) *Attorney, Agent, or Firm* — Mintz Levin Cohn Ferris Glovsky and Popeo, P.C.

(57) ABSTRACT

Methods and apparatus, including computer program products, are provided for power control of RF DACs. In one aspect there is provided an apparatus. The apparatus may include a multiphase clock generator to provide tunable multiphase clock signals including a first clock signal and a second clock signal; and a radio frequency digital-to-analog converter including a first input to receive digital input data, a second input to receive the first clock signal and the second clock signal, and an output to provide an analog output signal, wherein when at least one of a phase difference and a time difference between the first clock signal and the second clock signal is varied, a gain of the analog output signal is varied. Related apparatus, systems, methods, and articles are also described.

20 Claims, 6 Drawing Sheets

(56) References Cited

U.S. PATENT DOCUMENTS

| | | | |
|---|---|---|---|
| 2005/0225464 A1* | 10/2005 | Lin et al. | 341/144 |
| 2005/0227642 A1* | 10/2005 | Jensen | 455/127.1 |
| 2008/0132195 A1* | 6/2008 | Maxim et al. | 455/334 |
| 2009/0179674 A1* | 7/2009 | Tamura et al. | 327/155 |
| 2011/0227770 A1* | 9/2011 | Kaper et al. | 341/120 |
| 2013/0234871 A1* | 9/2013 | Eliezer et al. | 341/120 |
| 2014/0286360 A1* | 9/2014 | McHenry | 370/537 |

OTHER PUBLICATIONS

Chowdhury, D. et al. "*A Fully-Integrated Efficient CMOS Inverse Class-D Power Amplifier for Digital Polar Transmitters*", IEEE Journal of Solid-State Circuits. vol. 47, No. 5. May 2012, pp. 1113-1122.

Yoo, S-M et al. "*A Switched-Capacitor RF Power Amplifier*", IEEE Journal of Solid-State Circuits. vol. 46, No. 12. Dec. 2011, pp. 2977-2987.

* cited by examiner

US 9,197,241 B2

OUTPUT POWER CONTROL FOR RF DIGITAL-TO-ANALOG CONVERTER

FIELD

The subject matter described herein relates to power control.

BACKGROUND

A radio frequency (RF) digital-to-analog converter (DAC) refers to a digital-to-analog converter that may operate at RF frequencies at the radio front-end. The RF DAC may provide a digital-to-analog conversion, so that the analog output signal can be transmitted via an antenna. The RF DAC may also provide a frequency up-conversion and/or power amplification in a single circuit block in order to reduce complexity and/or power consumption in for example a wireless transmitter.

SUMMARY

Methods and apparatus, including computer program products, are provided for power control of RF DACs.

In one aspect there is provided an apparatus. The apparatus may include a multiphase clock generator to provide tunable multiphase clock signals including a first clock signal and a second clock signal; and a radio frequency digital-to-analog converter including a first input to receive digital input data, a second input to receive the first clock signal and the second clock signal, and an output to provide an analog output signal, wherein when at least one of a phase difference and a time difference between the first clock signal and the second clock signal is varied, a gain of the analog output signal is varied.

In some variations, one or more of the features disclosed herein including the following features can optionally be included in any feasible combination. The radio frequency digital-to-analog converter may include a voltage-mode radio frequency digital-to-analog converter. The multiphase clock generator may select from among a plurality of different clock signals including the first clock signal and the second clock signal. A control signal may tune the multiphase clock signals by at least selecting at least two of the plurality of different clock signals to serve as the first clock signal and the second clock signal. The multiphase clock generator may include at least one delay-locked loop to provide the plurality of different clock signals. The at least one delay-locked loop may include a plurality of delay cells, each of which provides at least one of the plurality of different clocks. When the phase difference between the first clock signal and the second clock signal is increased, the gain of the analog output signal may be increased, and wherein when the phase difference between the first clock signal and the second clock signal is decreased, the gain of the analog output signal may be decreased. A filter may be coupled to the radio frequency digital-to-analog converter to filter the analog output signal before transmission via an antenna. The radio frequency digital-to-analog converter may provide at least one of a digital-to-analog conversion of the digital input data, a frequency up-conversion, and a power amplification. At least one of a user equipment, a wireless access point, and a base station may include a transmitter comprising the apparatus. The first clock signal and the second clock signal may include differential signals.

The above-noted aspects and features may be implemented in systems, apparatus, methods, and/or articles depending on the desired configuration. The details of one or more variations of the subject matter described herein are set forth in the accompanying drawings and the description below. Features and advantages of the subject matter described herein will be apparent from the description and drawings, and from the claims.

Figure 1:
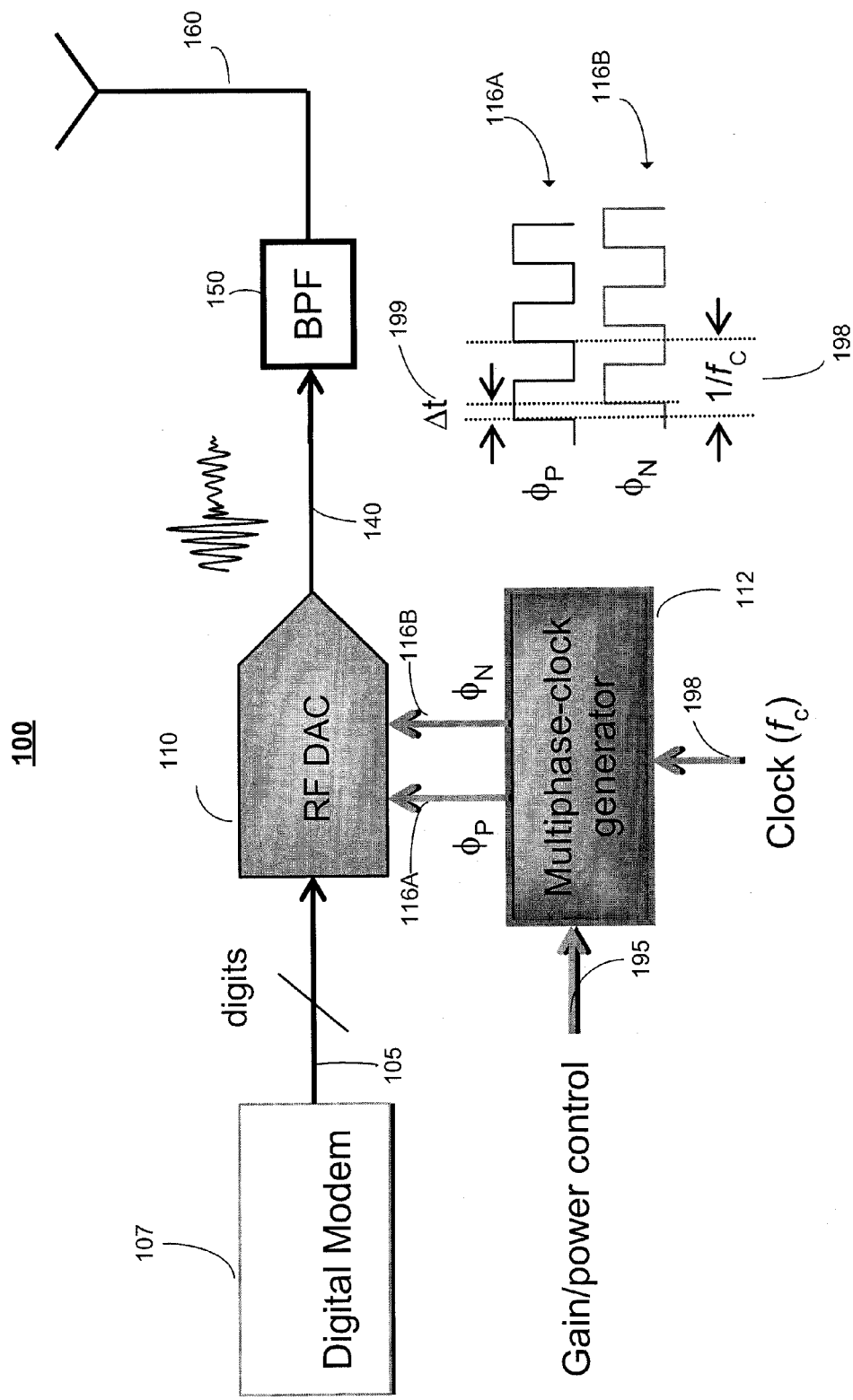
FIG. 1 depicts an example of a block diagram of an RF DAC, in accordance with some example embodiments.

Like labels are used to refer to same or similar items in the drawings.

DETAILED DESCRIPTION

Although radio frequency (RF) digital-to-analog converter (DAC) may provide digital-to-analog conversion, frequency up-conversion, and/or power amplification, RF power that is transmitted may be variable over a wide range (for example, about 60 dB) to meet the requirements of some systems, such as those systems associated with the Third Generation Partnership Project (3GPP).

In some example embodiments, the subject matter disclosed herein may provide a mechanism to vary the RF DAC's output power. The output power may, in some example embodiments, be varied based on adjusting a time (or phase) difference between sampling clocks serving as an input to the RF DAC.

FIG. 1 depicts an example of a system 100, in accordance with some example embodiments. The system 100 may include digital data 105 provided by for example a digital modem 107. The digital data 105 may be provided as an input to an RF DAC 110. The RF DAC 110 may provide a digital-to-analog conversion, a frequency up-conversion centered about an RF carrier frequency $f_c$, and/or a power amplification. Moreover, RF DAC 110 may generate analog output 140. This output signal 140 may then be filtered with for example a bandpass filter 150 before being transmitted by one or more antennas, such as antenna 160.

In some example embodiments, the RF DAC 110 may be implemented as a voltage-mode RF DAC 110. A voltage-mode RF DAC 110 may convert the digital data 105 into voltage domain signals by for example switching the bottom plates of an array of capacitors between circuit supply voltage and ground, and then summing the signals at the output node where all top plates of the capacitors are joined. The digital data input may turn on or off switches and may control a quantity of switched capacitors, to provide the digital-to-analog conversion.

In some example embodiments, RF DAC 110 may also be coupled to a multiphase clock generator 112. The multiphase clock generator 112 may generate two sampling clocks $\phi_P$ 116A and $\phi_N$ 116B, both of which serve as an input to RF DAC 110. These sampling clocks are used by RF DAC 110 to sample incoming digital data/digits 105 with a sampling period, T (for example, of $T=1/f_C$) 198 and convert the sampled digits into the voltage domain to generate an analog output 140.

In some example embodiments, tuning a time delay between sampling clocks $\phi_P$ 116A and $\phi_N$ 116B may vary an impulse response and, as a consequence, an amplitude of the analog output 140 of the RF DAC 110. The tuning of the sampling clocks $\phi_P$ 116A and $\phi_N$ 116B may be performed via a control signal 195. Therefore, rather than employ two sampling clocks having a constant 180 degree phase shift, multiphase clock generator 112 may, in some example embodiments, tune the time delay/phase difference between the sampling clocks $\phi_P$ 116A and $\phi_N$ 116B to vary the gain of the output 140 of RF DAC 110.

In some example embodiments, the multiphase clock generator 112 may include a delay-locked loop configured to provide a plurality of different sampling clocks. When this is the case, multiphase-clock generator 112 may select two sampling clocks from the plurality of different sampling clocks to serve as the variable/tunable sampling clocks 116A-B (labeled $\phi_P$ and $\phi_N$) input to multiphase clock generator 112 to control a desired gain provided by RF DAC 110. The tuning of the sampling clocks 116A-B may vary time delay 199 (labeled $\Delta t$, or phase difference, $\Delta\theta = 2\pi f_C \Delta t$) of the sampling clocks 116A-B $\phi_P$ and $\phi_N$ to produce a certain impulse response for the output signal 140.

In some example embodiments, tuning multiphase clock generator 112 may, as noted, allow gain/power control of the analog output 140 of RF DAC 110. By providing gain control at the RF DAC 110, the front-end of system 100 may, in some example embodiments, not need a separate attenuator at the output of RF DAC 110 to control the gain (for example, power, level, and the like) of analog output 140. This elimination of the attenuator may, in some example embodiments, improve power efficiency, especially at, for example, low transmit powers.

Although some of the examples described herein refer to tuning a time delay, $\Delta t$ between sampling clocks $\phi_P$ 116A and $\phi_N$ 116B, varying time delay also varies the phase difference ($\Delta\theta$) as well.

Figure 2A:
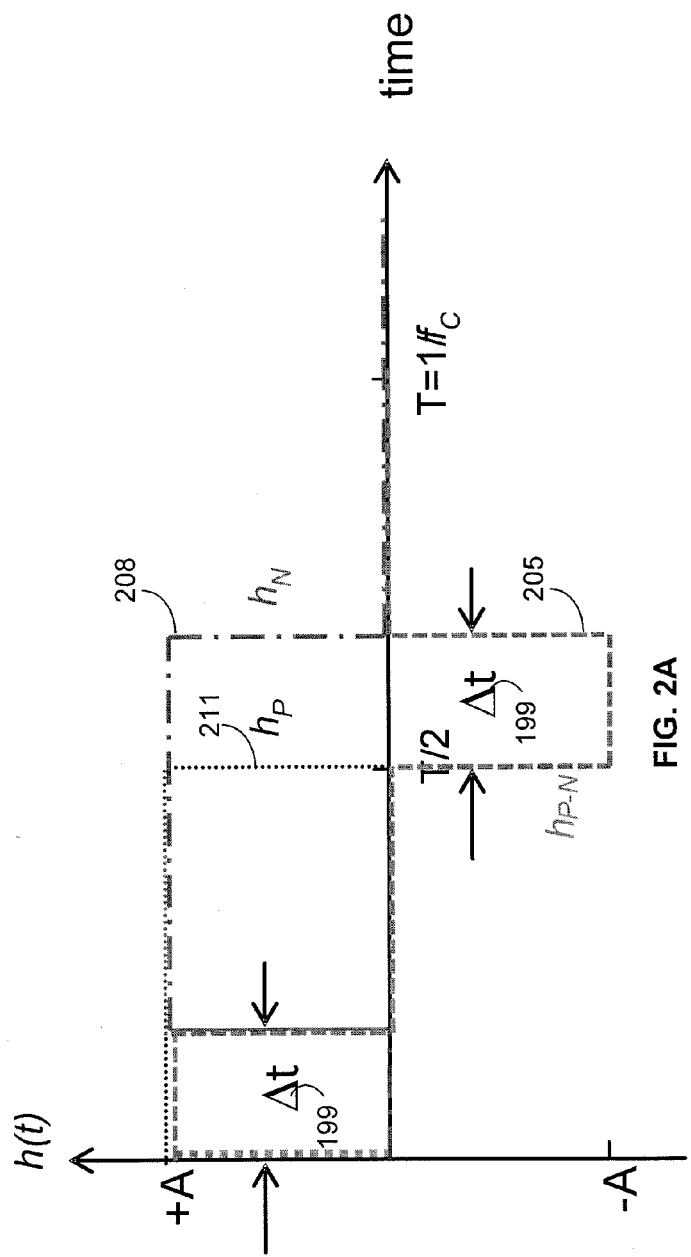
FIGS. 2A and 2B depict a plot of simulated responses of the RF DAC, in accordance with some example embodiments.

FIG. 2A depicts an illustrative example of an impulse response $h_{P-N}(t)$ 205 for the output signal 140 of voltage-mode RF DAC 110. In the example of FIG. 2A, sampling clocks $\phi_P$ 116A and $\phi_N$ 116B have about a fifty percent (50%) duty-cycle, and have a period T, which may be the inverse of the carrier frequency, fc (for example, $T=1/f_C$), although other duty cycles may be used as well. In the example of FIG. 2A, $h_P(t)$ 211 and $h_N(t)$ 208 represent the impulse responses due to $\phi_P$ 116A and $\phi_N$ 116B, respectively. Moreover, the amplitude, A, of the impulse responses may be a constant magnitude corresponding to a digital word being converted by the RF DAC 110.

Figure 2B:
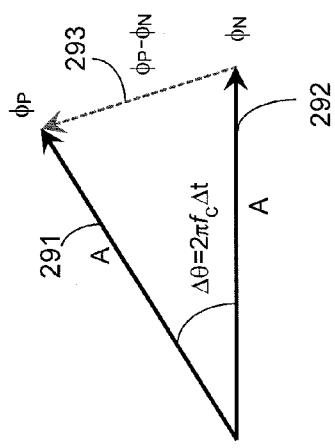

FIG. 2B shows a phase plot of $\phi_P$ 291 and $\phi_N$ 292 as well as the corresponding resultant 293 representative of output signal 140. FIG. 2B shows that the frequency response of $h_{P-N}(t)$ 205 may be directly proportional to the following equation:

$$2A*\sin(\Delta\theta/2) = 2A*\sin(\pi f_C \Delta t) \quad \text{Equation (1),}$$

wherein $\Delta t$ represents the time delay between $\phi_P$ and $\phi_N$, ($\Delta\theta$) represents the phase difference delay between $\phi_P$ and $\phi_N$, A represents the magnitude corresponding to a digital word being converted by RF DAC 110, and sin represents the sine function. As such, the gain of the output signal 140 of voltage-mode RF DAC 110 may be precisely tuned within a wide control range by varying the time delay $\Delta t$, which in this example may be controlled over the range of $1/\sin(\pi f_C \Delta t)$ by varying $\Delta t$.

FIG. 2B shows that as time delay/phase delay ($\Delta t/\Delta\theta$) 199 becomes smaller, the sampling clocks $\phi_P$ 291 and $\phi_N$ 292 may cancel each other out most of the time and thus deliver substantially no voltage signals at output 140, which may maintain relatively high efficiency even at low power levels.

Referring again to FIG. 2A, impulse response $h_{P-N}(t)$ 205 may also show that gain control provides pulse width power control but also offers a control range without the need for extremely narrow pulse generation. Although FIG. 2 depicts impulse responses corresponding to a square wave, this is merely an illustrate example as other types of responses may be achieved as well.

Figure 3A:
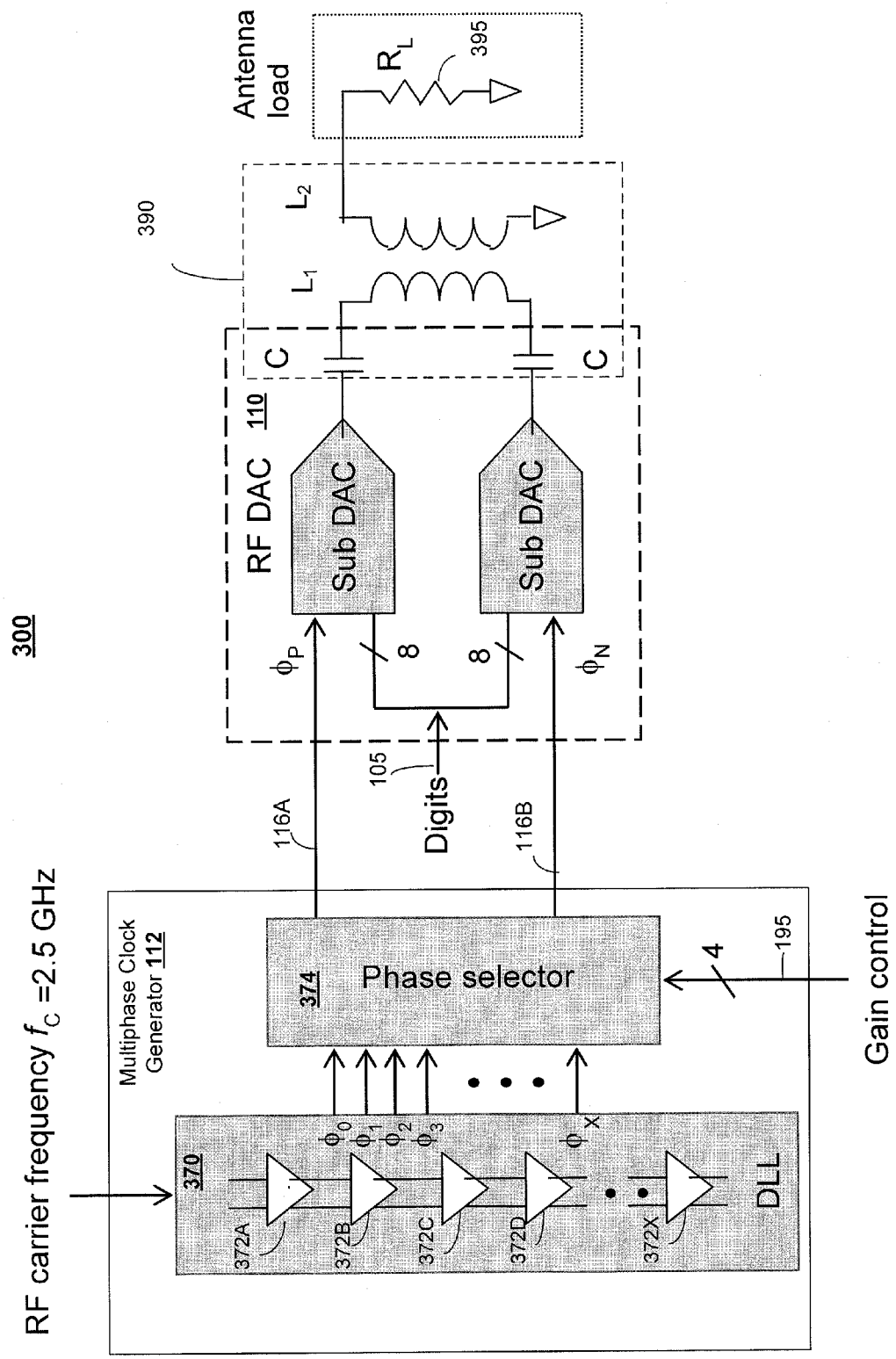
FIG. 3A depicts another example of a block diagram of an RF DAC, in accordance with some example embodiments.

FIG. 3A depicts another example system 300 including an example of a voltage-mode RF DAC 110, in accordance with some example embodiments. System 300 is similar to system 100 in some respects but includes example implementations for the RF DAC 110 and the multiphase clock generator 112. Moreover, system 300 may be used to provide, in some example implementations, an 8-bit, 2.5-Gigasample per second RF DAC, which has an output gain that can be varied based on time delay as disclosed herein, although other types of RF DACs may be implemented as well.

RF DAC 110 may include two voltage-mode DACs (labeled "sub DAC"). The sub DACs have delayed impulse responses as shown for example at FIGS. 2A-2B. RF DAC 110 may deliver voltage outputs to antenna load $R_L$ 395 via a serial inductance-capacitance (L-C) resonant network 390, which may include a transformer (labeled L1 and L2) and two capacitors (labeled C and C) intrinsic to each sub DAC.

In some example embodiments, multiphase clock generator 112 may include delay-locked loop (DLL) 370. The delay-locked loop 370 may further include a plurality of delay cells 372A-X to generate a plurality of time delay steps $\phi_0$ through $\phi_X$. These time delay steps $\phi_0$-$\phi_X$ may be selected by a phase selector 374 under the control of control lines 195 providing $\phi_P$ 116A and $\phi_N$ 116B. For example, depending on the desired time delay $\Delta t$ and corresponding gain desired at the output of RF DAC 110, control lines 195 may select two of the time delay steps $\phi_0$-$\phi_X$ in order to provide sampling clocks $\phi_P$ 116A and $\phi_N$ 116B. This selection from the plurality of delay cells 372A-X may be used to vary the time/phase difference between the sampling clocks $\phi_P$ 116A and $\phi_N$ 116B, which varies the gain at the output of voltage-mode RF DAC 110. Moreover, this gain control may be relatively immune to integrated circuit technology process, voltage, and/or temperature variations. In some example embodiments, the use of a plurality of delay cells 372A-X providing a plurality of clocks may provide relatively well-defined and stable clocks under a variety of conditions, such as voltage, temperature, and/or integrated circuit process.

Although FIG. 3A depicts the DLL 370 implemented using delay cells, multiphase clock generator 112 may be implemented using other mechanisms as well. Alternatively or additionally, multiple DLLs and/or a differential (for example, Vernier) DLL may be used to generate even additional (as well as smaller) time delay steps that are equal to the difference of two slightly different time delays in two separate delay-lock loops. Moreover, although FIG. 3A depicts using inverter-based delay cells in the DLL, other devices, such as resistance-capacitance delay lines, inductance-capacitance delay lines, varactor-based transmission lines, and the like may be used as delay cells as well.

In the example of FIG. 3A, DLL 370 may have 17 different phases selectable via control lines 195 to form a set of sampling clocks φ$_P$ and φ$_N$ serving as inputs to the RF DAC 110, and these clocks may generate 16 different power levels that are sin(nπ/32), n=1 . . . 16, relative to maximum (φ$_P$=π and φ$_N$=0), although other quantities may be implemented as well.

Figure 3B:
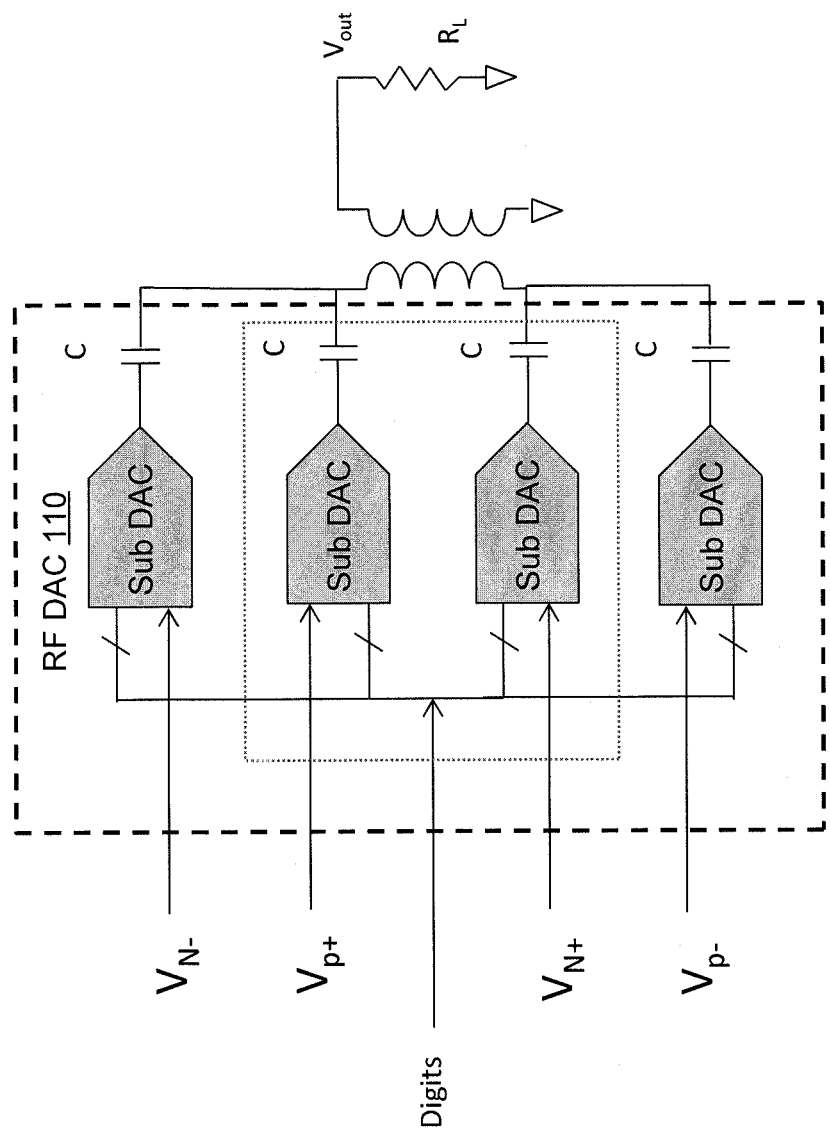
FIG. 3B depicts an example of an RF DAC configured for differential sampling clocks, in accordance with some example embodiments.

FIG. 3B depicts the RF DAC 110 implemented using sampling clocks φp 116A and φ$_N$ 116B configured as differential signals, in accordance with some example embodiments. Referring to FIG. 3B, φ$_P$ may be implemented as differential signals V$_{P+}$ and V$_{P-}$ (which are 180 degrees out of phase from each other), and φ$_N$ may be implemented as differential signals V$_{N+}$ and V$_{N-}$ (which are 180 out of phase from each other). The differential signals may enable the reduction of common-mode noise and/or some harmonics.

Figure 4:
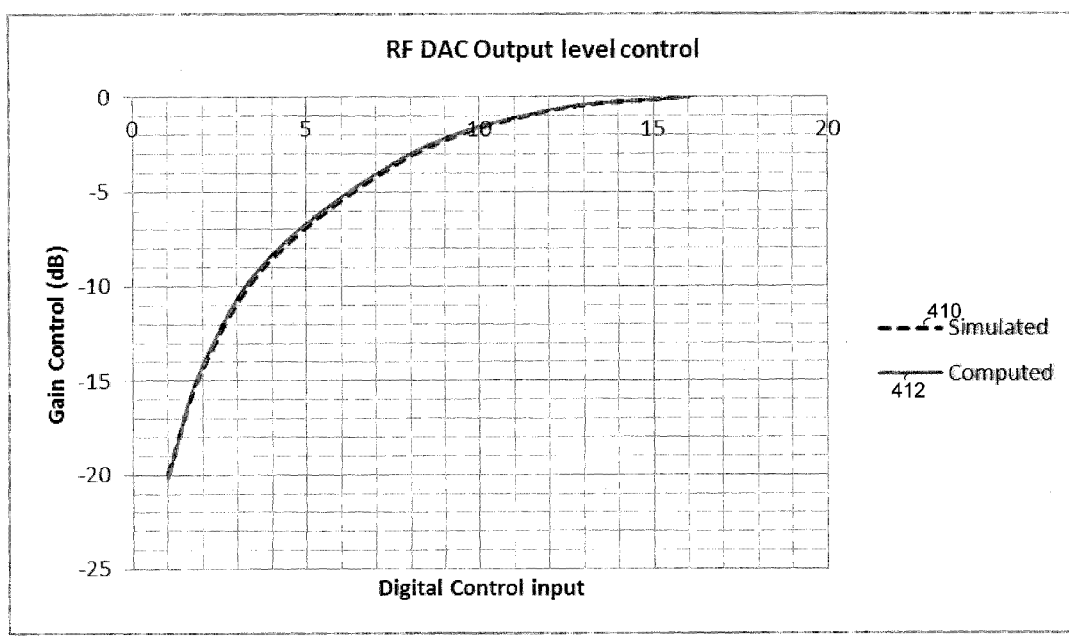
FIG. 4 depict a simulated performance plot of the RF DAC, in accordance with some example embodiments.

FIG. 4 depicts a plot of a simulation 410 of the power control range which may be attained using for example system 300. As a reference for comparison, the plot also depicts a calculated 412 range given by Equation (1) above. In the example of FIG. 4, 19.97 dB gain may be achieved with a 16-stage DLL locking to the 2.5 GHz RF carrier frequency f$_C$, exhibiting agreement with the computed gain control with a minimum delay of T/32=12.5 ps. To cover 16 power level settings, a 4-bit wide gain control word may be used to select a pair of clocks among 16 phases (from 0 to π with π/16 phase step) generated by DLL 370.

Although FIG. 4 as well as some of the other examples refer to specific values, these values are merely examples as other values may be achieved/used as well.

Figure 5:
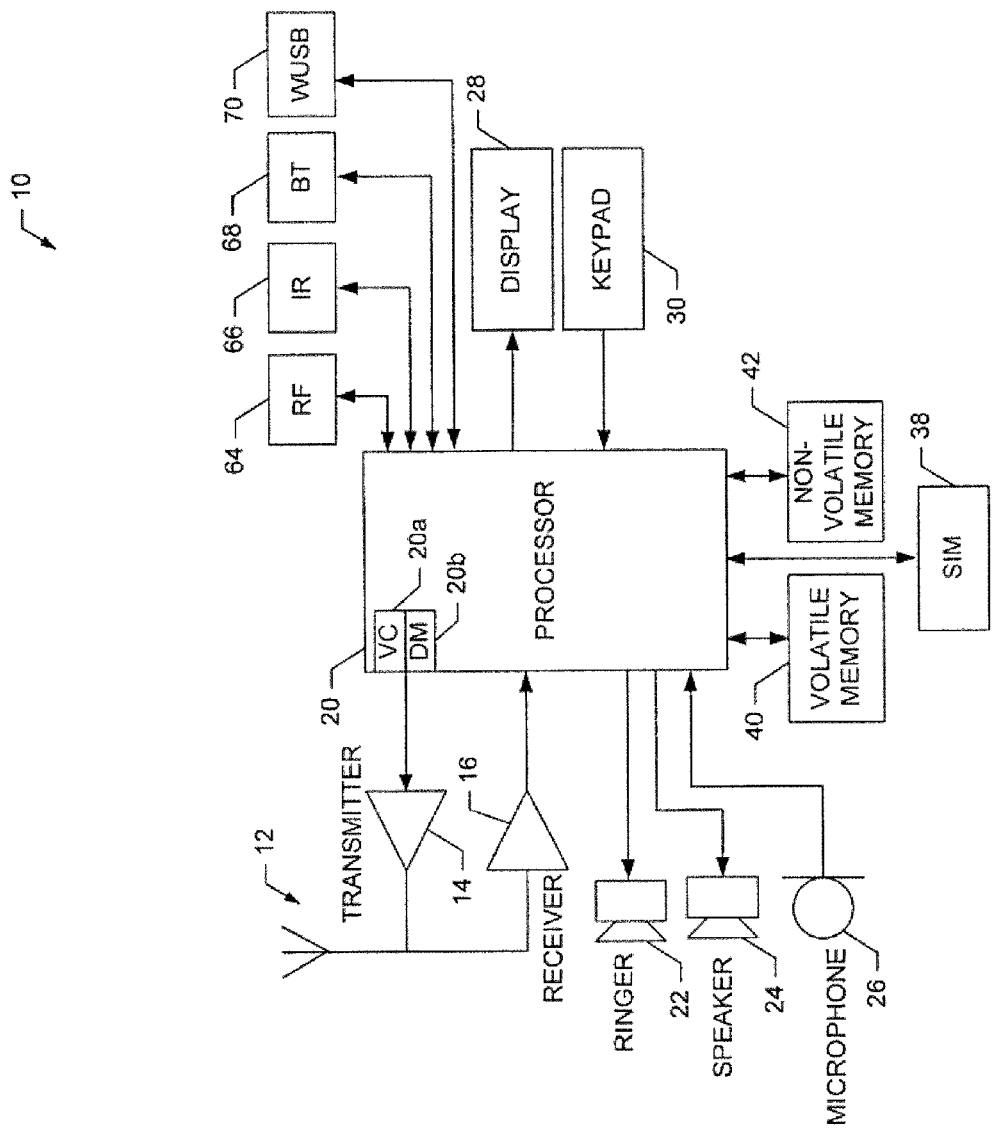
FIG. 5 depicts an example of a radio, in accordance with some example embodiments.

FIG. 5 illustrates a block diagram of an apparatus 10, in accordance with some example embodiments. For example, apparatus 10 may comprise a user equipment, such as a smart phone, smart object, mobile station, a mobile unit, a subscriber station, a wireless terminal, a tablet, a wireless plug-in accessory, or any other wireless device or radio including for example a base station or wireless access point.

The apparatus 10 may include at least one antenna 12 in communication with a transmitter 14 and a receiver 16. Alternatively transmit and receive antennas may be separate.

In some example embodiments, RF DACs 100/300 disclosed herein may, in some example, embodiments, be used at transmitter 14, although the RF DACs may be used in other locations as well.

The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 5 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local area network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 5, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth (BT) transceiver 68 operating using Bluetooth wireless technology, a wireless universal serial bus (USB) transceiver 70, a Bluetooth Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the WiFi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), a eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing functions of the user equipment/mobile terminal. The memories may comprise an identifier, such as an international mobile equipment identification (IMEI) code, capable of uniquely identifying apparatus 10. The functions may include one or more of the operations disclosed with respect to controlling and/or providing the RF DACs including multiphase clock generation disclosed herein. The memories may comprise an identifier, such as an international mobile equipment identification (IMEI) code, capable of uniquely identifying apparatus 10. In the example embodiment, the processor 20 may be configured using computer code stored at memory 40 and/or 42 to operations disclosed herein with respect to RF DACs including multiphase clock generation including control of the RF DACs.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 5, computer-readable medium may comprise a non-transitory computer-readable storage medium that may be any media that can contain or store the instructions for use by or in connection with an instruction execution system, apparatus, or device, such as a computer.

Without in any way limiting the scope, interpretation, or application of the claims appearing below, a technical effect of one or more of the example embodiments disclosed herein is a variable output power voltage-mode RF DAC which may eliminate the need for a variable attenuator at the output of the RF DAC to control signal level.

If desired, the different functions discussed herein may be performed in a different order and/or concurrently with each other. Furthermore, if desired, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments, these descriptions should not be viewed in a limiting sense. Rather, there are several variations and modifications that may be made without departing from the scope of the present invention as defined in the appended claims. Other embodiments may be within the scope of the following claims. The term "based on" includes "based on at least." The use of the phase "such as" means "such as for example" unless otherwise indicated.

What is claimed:
1. An apparatus comprising:
  a multiphase clock generator to provide tunable multiphase clock signals including a first clock signal and a second clock signal; and
  a radio frequency digital-to-analog converter including a first input to receive digital input data, a second input to receive the first clock signal and the second clock signal, and an output to provide an analog output signal, wherein when at least one of a phase difference and a time difference between the first clock signal and the second clock signal is varied, a gain of the analog output signal is varied.

2. The apparatus of claim 1, wherein the radio frequency digital-to-analog converter comprises a voltage-mode radio frequency digital-to-analog converter.

3. The apparatus of claim 1, wherein the multiphase clock generator selects from among a plurality of different clock signals including the first clock signal and the second clock signal.

4. The apparatus of claim 3, wherein a control signal tunes the multiphase clock signals by at least selecting at least two of the plurality of different clock signals to serve as the first clock signal and the second clock signal.

5. The apparatus of claim 3, wherein the multiphase clock generator includes at least one delay-locked loop to provide the plurality of different clock signals.

6. The apparatus of claim 5, wherein the at least one delay-locked loop includes a plurality of delay cells, each of which provides at least one of the plurality of different clocks.

7. The apparatus of claim 1, wherein when the phase difference between the first clock signal and the second clock signal is increased, the gain of the analog output signal is increased, and wherein when the phase difference between the first clock signal and the second clock signal is decreased, the gain of the analog output signal is decreased.

8. The apparatus of claim 1 further comprising:
a filter coupled to the radio frequency digital-to-analog converter to filter the analog output signal before transmission via an antenna.

9. The apparatus of claim 1, wherein the radio frequency digital-to-analog converter provides at least one of a digital-to-analog conversion of the digital input data, a frequency up-conversion, and a power amplification.

10. The apparatus of claim 1, wherein at least one of a user equipment, a wireless access point, and a base station includes a transmitter comprising the apparatus.

11. The apparatus of claim 1, wherein the first clock signal and the second clock signal comprise differential signals.

12. A method comprising:
generating, at a multiphase clock generator, tunable multiphase clock signals including a first clock signal and a second clock signal; and
receiving, at a radio frequency digital-to-analog converter, digital input data, first clock signal, and the second clock signal; and
providing, by the radio frequency digital-to-analog converter, an analog output signal representative of the digital input data, wherein when at least one of a phase difference and a time difference between the first clock signal and the second clock signal is varied, a gain of the analog output signal is varied.

13. The method of claim 12, wherein the radio frequency digital-to-analog converter comprises a voltage-mode radio frequency digital-to-analog converter.

14. The method of claim 12, wherein the multiphase clock generator selects from among a plurality of different clock signals including the first clock signal and the second clock signal.

15. The method of claim 14, wherein a control signal tunes the multiphase clock signals by at least selecting at least two of the plurality of different clock signals to serve as the first clock signal and the second clock signal.

16. The method of claim 14, wherein the multiphase clock generator includes at least one delay-locked loop to provide the plurality of different clock signals.

17. The method of claim 16, wherein the at least one delay-locked loop includes a plurality of delay cells, each of which provides at least one of the plurality of different clocks.

18. The method of claim 12, wherein when the phase difference between the first clock signal and the second clock signal is increased, the gain of the analog output signal is increased, and wherein when the phase difference between the first clock signal and the second clock signal is decreased, the gain of the analog output signal is decreased.

19. The method of claim 12, wherein the radio frequency digital-to-analog converter provides at least one of a digital-to-analog conversion of the digital input data, a frequency up-conversion, and a power amplification.

20. A non-transitory computer-readable storage medium include computer program code which when executed causes operations comprising:
generating, at a multiphase clock generator, tunable multiphase clock signals including a first clock signal and a second clock signal; and
receiving, at a radio frequency digital-to-analog converter, digital input data, first clock signal, and the second clock signal; and
providing, by the radio frequency digital-to-analog converter, an analog output signal representative of the digital input data, wherein when at least one of a phase difference and a time difference between the first clock signal and the second clock signal is varied, a gain of the analog output signal is varied.

* * * * *